(12) United States Patent
Ford et al.

(10) Patent No.: US 6,420,643 B2
(45) Date of Patent: Jul. 16, 2002

(54) SILICON THIN-FILM, INTEGRATED SOLAR CELL, MODULE, AND METHODS OF MANUFACTURING THE SAME

(75) Inventors: David H. Ford, Wilmington; Allen M. Barnett; Robert B. Hall, both of Newark, all of DE (US); James A. Rand, Landenberg, PA (US)

(73) Assignee: AstroPower, Inc., Newark, DE (US)

( * ) Notice: Subject to any disclaimer, the term of this patent is extended or adjusted under 35 U.S.C. 154(b) by 0 days.

(21) Appl. No.: 09/776,583

(22) Filed: Feb. 2, 2001

Related U.S. Application Data

(62) Division of application No. 09/345,862, filed on Jul. 1, 1999, now Pat. No. 6,211,455.
(60) Provisional application No. 60/091,662, filed on Jul. 2, 1998.

(51) Int. Cl.[7] .................. H01L 31/042; H01L 31/05; H01L 31/068
(52) U.S. Cl. .................. 136/244; 136/249; 136/251; 136/255; 136/256; 136/261; 136/252; 257/433; 257/461; 257/443; 257/454; 257/457; 257/459
(58) Field of Search ................. 136/249, 244, 136/251, 255, 256, 261, 252; 257/433, 461, 443, 454, 457, 459

(56) References Cited

U.S. PATENT DOCUMENTS

| | | | |
|---|---|---|---|
| 3,255,047 A | * | 6/1966 | Escoffery .............. 136/244 |
| 3,978,333 A | | 8/1976 | Crisman et al. .......... 136/255 |
| 4,083,097 A | * | 4/1978 | Anagnostou et al. ...... 136/251 |
| 4,254,386 A | | 3/1981 | Nemit et al. |
| 4,292,092 A | | 9/1981 | Hanak |
| 4,369,730 A | | 1/1983 | Izu et al. |
| 4,410,558 A | | 10/1983 | Izu et al. |
| 4,419,533 A | | 12/1983 | Czubatyj et al. |
| 4,454,372 A | | 6/1984 | Appleby |
| 4,478,879 A | | 10/1984 | Baraona et al. |
| 4,540,843 A | * | 9/1985 | Gochermann et al. ...... 136/251 |

(List continued on next page.)

FOREIGN PATENT DOCUMENTS

| | | |
|---|---|---|
| EP | 0 062 471 | 10/1982 |
| EP | 0 341 017 | 11/1989 |
| JP | 7-22618 | 1/1995 |
| JP | 63-42112 | 2/1998 |

OTHER PUBLICATIONS

Gee et al, "Emitter Wrap–Through Solar Cell," 23rd PVSC, pp. 265–270, May 10–14, 1993.*

(List continued on next page.)

Primary Examiner—Alan Diamond
(74) Attorney, Agent, or Firm—Burr & Brown

(57) ABSTRACT

A polycrystalline film of silicon including silicon grains having an aspect ratio, d/t, of more than 1:1, wherein "d" is the grain diameter and "t" is the grain thickness. The polycrystalline film of silicon can be used to form an electronic device, such as a monolithically integrated solar cell having ohmic contacts formed on opposed surfaces or on the same surface of the film. A plurality of solar cells can be monolithically integrated to provide a solar cell module that includes an electrically insulating substrate and at least two solar cells disposed on the substrate in physical isolation from one another. Methods for manufacturing the film, solar cell and solar cell module are also disclosed. The simplified structure and method allow for substantial cost reduction on a mass-production scale, at least in part due to the high aspect ratio silicon grains in the film.

21 Claims, 5 Drawing Sheets

U.S. PATENT DOCUMENTS

| | | | |
|---|---|---|---|
| 4,594,471 A | | 6/1986 | Yamazaki |
| 4,677,250 A | | 6/1987 | Barnett et al. .............. 136/258 |
| 4,697,041 A | | 9/1987 | Okaniwa et al. |
| 4,826,777 A | | 5/1989 | Ondris |
| 5,057,163 A | * | 10/1991 | Barnett et al. .............. 136/258 |
| 5,211,761 A | * | 5/1993 | Noguchi et al. ............ 136/258 |
| 5,266,125 A | | 11/1993 | Rand et al. |
| 5,336,335 A | | 8/1994 | Hall et al. |
| 5,356,509 A | | 10/1994 | Terranova et al. |
| 5,496,416 A | | 3/1996 | Hall et al. |
| 5,659,133 A | | 8/1997 | Sims et al. |
| 6,080,928 A | | 6/2000 | Nakagawa |
| 6,111,191 A | | 8/2000 | Hall et al. .................. 136/258 |
| 6,211,455 B1 | * | 4/2001 | Ford et al. .................. 136/258 |

OTHER PUBLICATIONS

Gee et al, "Simplified Module Assembly Using Back–Contact Crystalline–Silicon Solar Cells," 26th PVSC, pp. 1085–1088, Sep. 30–Oct. 3, 1997.*

Swanson et al., "Point–Contact Silicon Solar Cells," IEEE Transactions on Electron Devices, Vo. ED–31, No. 5, May 1984, pp. 661–664.

Michael D. Lammert & Richard J. Schwartz "The Interdigitated Back Contact Solar Cell: A Silicon Solar Cell for Use in Concentrated Sunlight," IEEE Transactions on Electron Devices, vol. ED–24, No. 4, Apr. 1997, pp. 337–342.

R.N. Hall & T.J. Soltys, "Polka Dot Solar Cell," $14^{th}$ IEEE Photovoltaic Specialists Conference Proceedings, pp. 550–552 (1980).

James M. Gee, et al., "Emiter Wrap–Through Solar Cell," $23^{rd}$ IEEE Photovoltaic Specialists Conference Proceedings, pp. 265–270 (1993).

D.M. Chapin, et al., "A New Silicon p–n Junction Photocell for Converting Solar Radiation into Electrical Power," Journal of Applied Physics, vol. 25, p. 676, (1954).

Patent Abstracts of Japan, vol. 018, No. 603 (E–1632), Nov. 16, 1994 & Abstract for 06–232391 A (Kawasaki Steel Corp.), Aug. 19, 1994.

J.A. Rand, et al., "Monolithically Integrated Silicon–Film Photovoltaic Modules," Proceedings of the Photovoltaic Specialists Conferences, US, New York, IEEE, vol. Conf. 23, 1993, pp. 214–219.

D.J. Aiken, et al., "Thin Substrate–Based Crystalline Silicon Solar Cells With No Grid Shading," Proceedings of the 26th IEEE Photovoltaic Specialists Conference, Sep. 29–Oct. 3, 1977, pp. 763–766, XP 002135620, Anaheim, CA, USA.

D.H. Ford et al., "Development of Light–Trapped, Interconnected, Silicon–Film Modules," 26th IEEE Photovoltaic Specialists Conference, Sep. 29–Oct. 3, 1977, pp. 631–634, Anaheim, CA, USA.

K, Ishii, et al., Sub–5 $\mu$m thin Film Crystalline Silicon Solar Cell on Alumina Ceramic Substrate, Japanese Journal of Applied Physics, vol. 32, No. 6A, Part 02, Jun. 1, 1993, pp. L770–L773.

IBM Technical Disclosure Bulletin, 18(9), pp. 3063–3064, Feb. 1976.

* cited by examiner

SILICON THIN-FILM, INTEGRATED SOLAR CELL, MODULE, AND METHODS OF MANUFACTURING THE SAME

CROSS REFERENCE TO RELATED APPLICATION

This is a divisional application of U.S. Ser. No. 09/345,862, filed Jul. 1, 1999, now U.S. Pat. No. 6,211,455, which claims the benefit of provisional application Ser. No. 60/091,662, filed Jul. 2, 1998, the entirety of which is incorporated herein by reference.

FIELD OF THE INVENTION

The present invention relates to a monolithically integrated solar cell module, and in particular, a module including a plurality of integrated solar cells each containing an active polycrystalline silicon layer having silicon grains with a high aspect ratio.

BACKGROUND OF THE INVENTION

Photovoltaic semiconductor devices, also known as solar cells, convert sunlight into electricity. In theory, solar cells could provide an infinite supply of renewable energy. The interest in solar cell technology was perhaps at its peak during the oil shortages of the 1970's. Since that time only a few select companies have devoted substantial research and development funds to solar cell technology; most major manufacturers abandoned the technology due to economic considerations coupled with the conversion inefficiencies inherent in photovoltaic semiconductor materials. The companies that remain dedicated to solar cell technology have made significant improvements in solar cell and module design, thus increasing output efficiencies and reducing manufacturing cost. Substantial room for improvement, however, remains.

A typical solar cell consists of a wafer of p-type silicon having an upper n-type region diffused therein. The regions adjacent to the interface between the p-type silicon and the n-type silicon define the p-n junction of the device. A unitary metal electrode is deposited on the bottom of the p-type silicon wafer and a comb-shaped metal electrode is deposited on the upper surface of the n-type silicon region to collect charges generated at the p-n junction when the solar cell is exposed to sunlight.

One of the inherent problems with solar cells is the inability of individual solar cells to produce significant voltage levels. For example, most individual solar cells on the market today produce about ½ volt per cell. Consequently, it is necessary to arrange a plurality of solar cells in a series-connected array in order to provide a solar cell module of appreciable voltage rating.

While modules of discrete, series-connected solar cells have been widely adopted in industry, there are several problems with this design. First, to provide a solar cell module rated at, say, 18 volts, it is necessary to separately manufacture and handle 36 discrete, ½-volt solar cells and then "string" the cells together in series to achieve the desired voltage rating. Variations in performance among the individual solar cells can lead to unacceptable performance of the overall module, and moreover, failure of a single solar cell can lead to failure of the entire module.

Second, the necessity of handling 36 separate solar cells to build a single solar cell module rated at 18 volts inherently increases the overall cost to manufacture such a module.

Third, in order to "string" the individual cells together, it is necessary to employ external metallization "tabs" welded or soldered together. It is estimated that these metallized interconnects account for more than 90 percent of all failures in solar cell modules.

Significant strides have been made to reduce the overall cost of these types of solar cell modules, particularly in the area of materials. For example, significant reductions in cost of solar cells have been achieved by using thin-film solar cells such as the SILICON-FILM™ solar cell described by A. M. Barnett et al. in U.S. Pat. No. 5,057,163, which is incorporated herein by reference. The SILICON-FILM™ technology makes use of proprietary heating steps to provide polycrystalline silicon thin films of unique microstructure, which enhances the performance of solar cells employing such polycrystalline silicon films. This growth technology continues to improve, such as disclosed in U.S. Pat. Nos. 5,336,335 and 5,496,416, and as disclosed in U.S. patent application Ser. No. 09/033,155, filed Mar. 2, 1998, now U.S. Pat. No. 6,111,191 all of which are incorporated herein by reference.

Even though the SILICON-FILM™ and growth technologies discussed above have provided significant cost reduction in the manufacture of silicon solar cell modules, the problems associated with handling large numbers of separate cells to manufacture a single module, and the tabbing and stringing operations necessary to connect the discrete solar cells, still present significant obstacles to large-scale, low-cost manufacture of high voltage modules.

Having recognized some of the inherent problems discussed above, the industry has attempted to provide monolithic designs wherein a plurality of isolated solar cells are formed in an integrated manner on a single substrate. For example, Warner U.S. Pat. No. 3,994,012 discloses a monolithic photovoltaic semiconductor device including a plurality of solar cells isolated from one another on a single substrate. The complex manufacturing process used to produce such a device, however, is impractical and cost prohibitive on a mass production/commercial scale.

Chiang et al. U.S. Pat. No. 4,173,496 also discloses an integrated solar cell array wherein a plurality of solar cells are formed on a substrate of single crystal silicon in physical isolation from one another. Like the process of Warner, however, the complexity of the process disclosed in Chiang et al. makes the device prohibitively expensive to manufacture on a mass-production scale. Moreover, the cost drawbacks inherent in the use of single crystal silicon make the device per se unacceptable for mass-production and commercial viability.

Rand et al. U.S. Pat. No. 5,266,125 represents a significant improvement over the devices and processes disclosed in Warner and Chiang, but still requires relatively complex steps to manufacture the device. For example, the device shown in FIG. 1 of Rand et al. requires a plurality of metal interconnects disposed in the dice-isolated trenches separating each individual solar cell. Not only are such metallization strips difficult and expensive to install, but also the width of the trenches themselves reduces the upper surface area of the module available for interaction with incident sunlight. While the device in FIG. 4 of Rand et al. does not require the metallization strips of the device in FIG. 1 of Rand, it does require sub-substrate conducting regions to provide series connection of adjacent cells. This makes the overall process for making the device shown in FIG. 4 of Rand rather complex, and thus, rather expensive, especially on a mass-production scale.

Thus, there is significant room for improvement in high voltage solar cell modules. The miniaturization of electronic devices necessarily requires a corresponding miniaturization of the solar cell modules used to power or recharge the batteries of those devices. Monolithic solar cell module designs are particularly attractive in this regard, since a solar cell of fixed area can be segregated into as many isolated solar cells as needed to achieve the voltage requirement of the associated electronic device. To date, however, no entity has been able to provide a high-efficiency monolithic solar cell module at low manufacturing cost.

One solution is to use polycrystalline silicon as opposed to either single crystal or amorphous silicon. It would be necessary, however, to use relatively thick active layers when using polycrystalline silicon, in order to establish silicon grains having a width sufficient to prevent grain boundary-induced minority carrier recombination. That is, even with the growth techniques discussed above, it is difficult to form silicon grains having an aspect ratio (d:t) of more than 1. Thus, a silicon grain having a diameter of 40 microns, for example, would require an active layer thickness of 40 microns.

SUMMARY OF THE INVENTION

It is a first object of the present invention to provide a polycrystalline film of silicon having silicon grains with a sufficiently high aspect ratio that allows the formation of relatively thin, electronically effective active layers for devices such as solar cells.

It is another object of the present invention to provide a monolithically integrated solar cell that is easy and inexpensive to manufacture on a mass-production scale.

It is yet another object of the present invention to provide a monolithically integrated solar cell module that is easy and inexpensive to manufacture on a mass-production scale, and exhibits superior reliability and performance.

In accordance with a first aspect of the present invention, a polycrystalline film ofsilicon is provided with silicon grains having an aspect ratio, d/t, of more than 1:1, wherein "d" is the grain diameter and "t" is the grain thickness. The aspect ratio of the silicon grains is preferably at least 5:1, more preferably at least 10:1, and most preferably at least 20:1. These high aspect ratios are achieved by combining thin-film forming techniques with the growth techniques discussed above. Such high aspect ratios provide a materials cost savings by allowing the formation of relatively thin active layers having grains that are wide enough to operate effectively in an electronic device, such as a solar cell.

In accordance with a second aspect of the present invention, a monolithically integrated solar cell is provided that includes (a) an electrically insulating substrate, (b) a first ohmic contact layer formed on or in the substrate, (c) a first layer of doped semiconductor material formed on the first ohmic contact layer, (d) a second layer of doped semiconductor material formed on the first layer of doped semiconductor material, and (e) a second ohmic contact layer formed on the second layer of doped semiconductor material in physical isolation from the first ohmic contact layer. The first ohmic contact layer comprises a highly electronically conductive material having a first conductivity type and the first layer of doped semiconductor material has a first conductivity type the same as that of the first ohmic contact layer. The second layer of doped semiconductor material has a conductivity type opposite to that of the first layer of doped semiconductor material, such that the first and second layers of doped semiconductor material form the active p-n junction of the solar cell.

This solar cell is manufactured by forming the first ohmic contact layer on or in the electrically insulating substrate, forming the first layer of doped semiconductor material on the first ohmic contact layer, forming the second layer of doped semiconductor material on the first layer of doped semiconductor material, and forming the second ohmic contact layer on the second layer of doped semiconductor material in physical isolation from the first ohmic contact layer.

This simplified structure and method allow for substantial cost reduction on a mass-production scale. Manufacturing cost is reduced even further by forming relatively thin, electronically effective active layers in the solar cell using the thin-film growth techniques discussed above.

In accordance with a third aspect of the present invention, a monolithically integrated solar cell module is provided that includes an electrically insulating substrate and at least two solar cells disposed on the substrate in physical isolation from one another. Each solar cell includes a first ohmic contact layer formed on or in the substrate, a first layer of doped semiconductor material formed on the first ohmic contact layer, a second layer of doped semiconductor material formed on the first layer of doped semiconductor material, and a second ohmic contact layer formed on the second layer of doped semiconductor material in physical isolation from the first ohmic contact layer. The first layer of doped semiconductor material has a first conductivity type and the second layer of doped semiconductor material has a conductivity type opposite to that of the first layer, such that a p-n junction is formed between the first and second layers of doped semiconductor material. An electronically conductive interconnect provides electrical communication between the second ohmic contact layer of one solar cell and the first ohmic contact layer of the other solar cell while maintaining the two solar cells in physical isolation from one another.

The simplified structure of this solar cell module enables it to be manufactured with high reliability at relatively low cost. Additionally, the use of an electronically conductive interconnect that provides electrical communication between the two solar cells while maintaining physical isolation therebetween provides a performance benefit. Specifically, adjacent cells on the substrate can be formed very closely together, as there is no need for a relatively wide isolation trench to accommodate a metal interconnect that also physically joins the cells together. The upper surface area of the solar cell module that is designed to receive sunlight is increased by reducing the size of the isolation regions between adjacent solar cells.

In accordance with a fourth aspect of the present invention, a monolithically integrated solar cell is provided that includes (a) an electrically insulating substrate, (b) a first ohmic contact formed on or in the substrate, (c) a second ohmic contact formed on or in the substrate in spaced juxtaposition with the first ohmic contact, and (d) a layer of doped semiconductor material disposed on the first and second ohmic contacts. The layer of doped semiconductor material includes either an upper p-region and a lower n-region adjacent the first ohmic contact, or an upper n-region and a lower p-region adjacent the second ohmic contact, wherein a p-n junction is formed between the upper and lower regions.

The structure of this solar cell not only represents a breakthrough in manufacturing, but it also provides isolation of both ohmic contacts below the active layers of the cell. This particular feature frees up the entire upper surface of the cell to receive incident sunlight. Additionally, it provides the much needed benefit of protecting the ohmic contacts from damage due to exposure to the environment.

In accordance with a fifth aspect of the present invention, a monolithically integrated solar cell module is provided that includes an electrically insulating substrate and at least two solar cells disposed on the substrate. Each solar cell includes (a) a first ohmic contact formed on or in the substrate, (b) a second ohmic contact formed on or in the substrate in spaced juxtaposition with the first ohmic contact, and (c) a layer of doped semiconductor material disposed on the first and second ohmic contacts. The layer of doped semiconductor material includes either an upper p-region and a lower n-region adjacent the first ohmic contact, or an upper n-region and a lower p-region adjacent the second ohmic contact, wherein a p-n junction is formed between the upper and lower regions. The solar cells are connected physically and electrically only at laterally terminal end portions of the first ohmic contact of one solar cell and the second ohmic contact of the other solar cell. In addition to exhibiting the benefits attributable to the individual solar cells discussed above, this module also exhibits maximum incident surface area, as there is zero grid obscuration of the entire active area of the module.

These and other objects of the present invention will be better understood by reading the following detailed description in combination with the attached drawings of preferred embodiments of the invention.

DETAILED DESCRIPTION OF THE INVENTION

Figure 1:
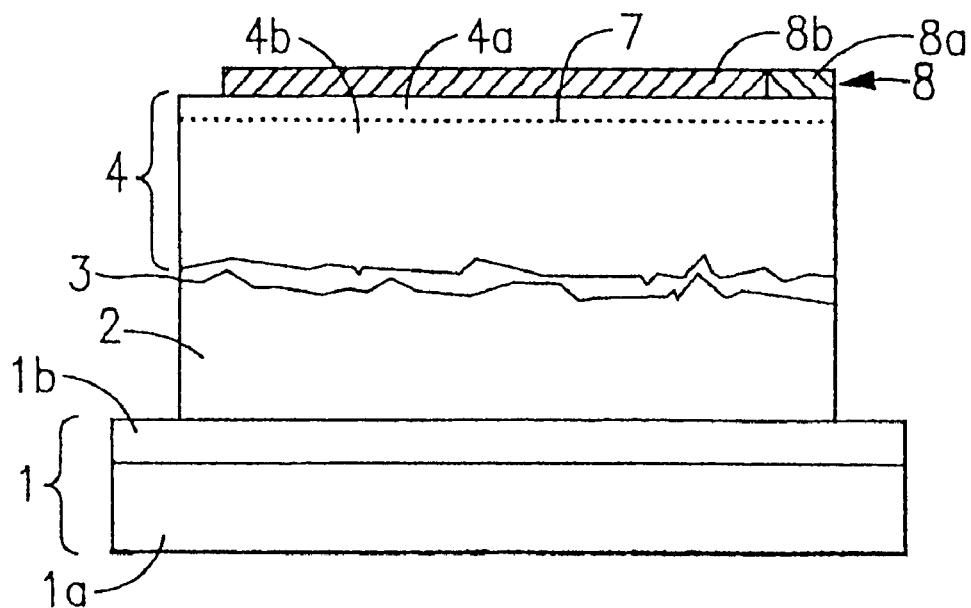
FIG. 1 is a cross-sectional view of a monolithically integrated solar cell in accordance with one embodiment of the present invention.

FIG. 1 is a cross-sectional view of a monolithically integrated solar cell in accordance with one embodiment of the present invention. The solar cell is formed on a supporting substrate 1. Substrate 1 must be of sufficient thickness to provide mechanical support for the solar cell, have a coefficient of thermal expansion which matches, or at least closely matches (i.e., within 10%), that of the semiconductor material used to form the solar cell and be electrically insulating. It is preferred that substrate 1 also be chemically inert and be optically reflective. The material of substrate 1 must also have sufficient refractory properties so as to withstand the temperature levels of the manufacturing process used to form the solar cell.

It is possible to use a two-layered substrate structure as shown in FIG. 1, wherein a substrate surface layer 1b is formed on a base substrate 1a. In this case, it is the substrate surface layer 1b that must satisfy the criteria discussed above with the exception of mechanical strength, which can be satisfied by base substrate 1a. That is, substrate surface layer 1b provides electrical insulation and prevents chemical diffusion between base substrate 1b and the other layers of the device. If desired, substrate surface layer 1b can also reflect incident light back through the active layers of the device.

It is generally preferred to use a single-layered substrate that can satisfy all of the criteria listed above. A preferred material is the mullite family of alumino-silicates, although alumina or silica could also be used. The thickness of such a single-layered substrate preferably ranges from 5 mils to 50 mils, with the specific thickness being dependent upon satisfaction of the above criteria compared to other factors such as manufacturing cost and device weight.

In the case of a double-layered substrate, the first layer 1a will generally perform the functions of mechanical support and electrical insulation. For this, the mullite family of materials mentioned above is preferred. The top layer 1b will generally serve as a diffusion barrier and light reflector. Suitable materials include titanium nitride, silicon oxinitride, aluminum nitride, and silicon nitride.

A first ohmic contact layer 2 of highly doped semiconductor material is formed on the upper surface of supporting substrate 1. A highly doped semiconductor material is one having a dopant concentration of at least $3\times10^{18}$ cm$^{-3}$. For the ease of reference only, layer 2 will be discussed in terms of a highly doped p-type layer, the concentration of which will be designated as "p+", although highly doped n+-type materials could be used as well (this interchangeability applies hereinafter for all semiconductor layers). Layer 2 effectively serves as the contact for carrying current from the active region of the solar cell. While layer 2 could be metal, highly electronically conductive materials are preferred in order to withstand the relatively high temperatures used to manufacture the solar cell, as discussed later herein. While the preferred material is silicon, other materials, such as carbides (e.g., boron carbide, silicon carbide), silicides, conductive nitrides, and graphite could also be used, provided the resistivity of such materials allows adequate electronic conduction laterally along layer 2 into the plane of the paper of FIG. 1. While there is no specific limitation on the thickness of layer 2, a preferred thickness range is 5 to 50 microns.

Reference number 3 refers to a region, more than a specific layer. That is, in certain embodiments region 3 will comprise a specific material (e.g., silicon dioxide) acting as a passivation layer, while in other embodiments it may exist only partial—or not at all depending on its intended functionality. In a first embodiment a barrier layer 3 is formed on the upper surface of layer 2, and serves as a passivation layer for the active layers of the solar cell to be formed thereon. In another embodiment region 3 serves as a mechanical barrier to prevent mixing of the material of layer 2 with the materials of the upper active layers of the solar cell. Region 3 could also function as a reflector layer for incident sunlight passing through the active layers of the solar cell. It should also be understood that region 3 may serve some or all of these functions-depending on the materials used, and thicknesses, of the other layers as will be explained in greater detail below.

While the material of layer 3 is not particularly limited, it must be able to satisfy the passivation, reflection and other criteria as required. Examples of suitable materials include silicon oxide, silicon dioxide, sialon, silicon nitride, silicon oxynitride, silicon carbide and silicon oxycarbide. These materials can be deposited by any known deposition technique or by chemical treatment of the underlying layer 2 if it is formed of silicon. The major limitation with respect to the material for region 3 is that it must not be readily soluble in the material of the adjacent semiconductor layers. Specifically, the semiconductor layers may become molten during the manufacture of the solar cell, as discussed in more detail below, and the material of layer 3 must not readily dissolve in the molten material making up the adjacent semiconductor layers.

The thickness of region 3 varies from embodiment to embodiment depending on its intended function. It must allow electronic conduction from the active layers of the solar cell above, to layer 2 disposed below region 3. It is preferred to use vias through region 3 to allow for such conduction, although it is conceivable that some materials could be applied as a very thin layer and achieve the necessary conduction without vias. At the same time, however, the thickness of region 3 must be sufficient to fulfill at least the passivation and mechanical support criteria discussed above. It is preferred that the thickness of region/layer 3 range from 200 Angstroms up to 2 microns, and more preferably range from about 1 to 2 microns.

If the material for layer 2 is highly doped p+-type semiconductor material, then the material of layer 4 should be doped p-type semiconductor material (having a dopant concentration ranging from $10^{14}$ cm$^{-3}$ to $10^{17}$ cm$^{-3}$). While there is no specific limitation on the thickness of layer 4, it preferably ranges from 5 microns to 150 microns. The competing interests of thin layers (to reduce cost) and thick layers (to maximize absorption) are well known and will not be discussed herein. In addition, variations in thickness of layers 2 and 4 will be selected based on the materials used and ultimate configuration sought. For example:

(1) If layers 2 and 4 are both plasma sprayed, then region 3 is needed as a discrete layer to prevent the mixing of the two materials;

(2) If a melt and regrowth process is used to form layer 2, which achieves the desired aspect ratio for the grains, and layer 4 is deposited with CVD then:

(a) if layer 4 is relatively thin (e.g., around 30 microns), a discrete layer at region 3 is needed if a subsequent melt and regrowth to achieve the desired aspect ratio is desired; region 3 is not needed if layer 4 is grown epitaxially, seeded from layer 2, or (b) if layer 4 is relatively thick (e.g., 150 microns), no discrete layer at region 3 is needed because the material is thick enough to effect collection without the need for light trapping; or (4) If layer 2 is formed as a discontinuous layer, then a discrete material at region 3 may or may not be necessary depending upon the composition of the underlying substrate 1.

A thin region 4a is created by diffusion into the upper surface of layer 4. If the lower region 4b of layer 4 is doped p-type semiconductor material, then upper region 4a would be doped n-type semiconductor material in order to provide a p-n junction 7. The thickness of upper region 4a should range from 0.03 to 2.0 microns.

A second ohmic contact layer 8 is formed on the upper surface of upper region 4a and serves to carry current from region 4a when the solar cell is connected to a load. Layer 8 preferably takes the form of a comb-shaped electrode extending laterally across the solar cell into the plane of the paper of FIG. 1. The electrode preferably includes a spine 8a extending into the plane of the paper of FIG. 1 and a plurality of fingers 8b extending perpendicular to spine 8a.

FIGS. 2A–2F are perspective views showing a preferred embodiment for forming a plurality of solar cells as shown in FIG. 1 in the form of a monolithically integrated solar cell module 31.

Figure 2A:
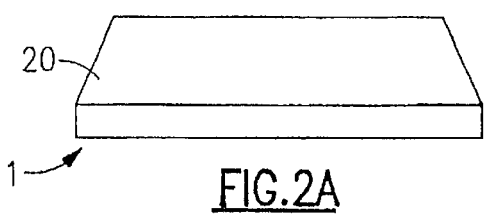
FIGS. 2A–2F depict a preferred method for producing the solar cell of FIG. 1, with FIG. 2F depicting a monolithically integrated solar cell module in accordance with another preferred embodiment of the present invention.
Figure 2B:
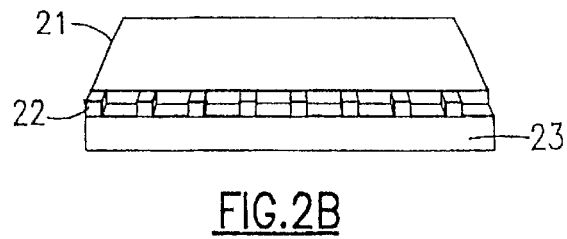

A suitable material is provided to serve as supporting substrate 1. Although a single-layer substrate is shown in the drawings, a two-layer substrate, as described above, could also be used. A layer 21 of highly doped p+-type silicon is deposited on an upper surface 20 of substrate 1 (FIG. 2B). Layer 21 is preferably plasma sprayed through a mask so as to form a patterned layer having a plurality of tabs 22 extending laterally outwardly from the main portion of layer 21 proximate a first side surface 23 of substrate 1. Other PVD thin-film techniques, such as electron beam deposition and sputtering, and CVD techniques, could be used to form layer 2.

Figure 2C:
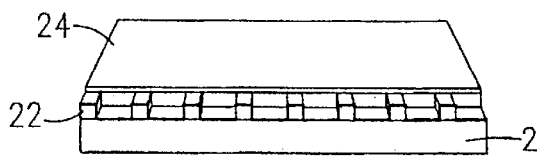
Figure 2D:
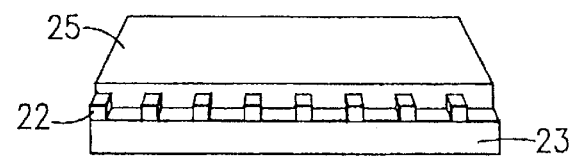

When desired, a suitable material for formation of the barrier region (reference number 3 of FIG. 1) is then deposited as a continuous layer 24 on the main region of layer 21, leaving tab portions 22 exposed (FIG. 2C). A layer 25 of p-type silicon is then deposited over layer 24 (FIG. 2D), again leaving tab portions 22 exposed, and then the upper surface of that layer is subjected to thermal/chemical treatment to form an upper n-type region therein.

Figure 2E:
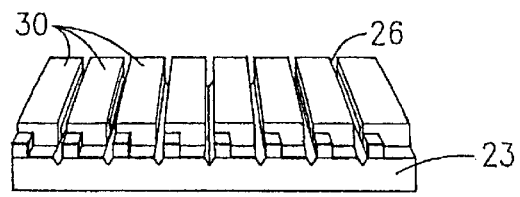
Figure 2F:
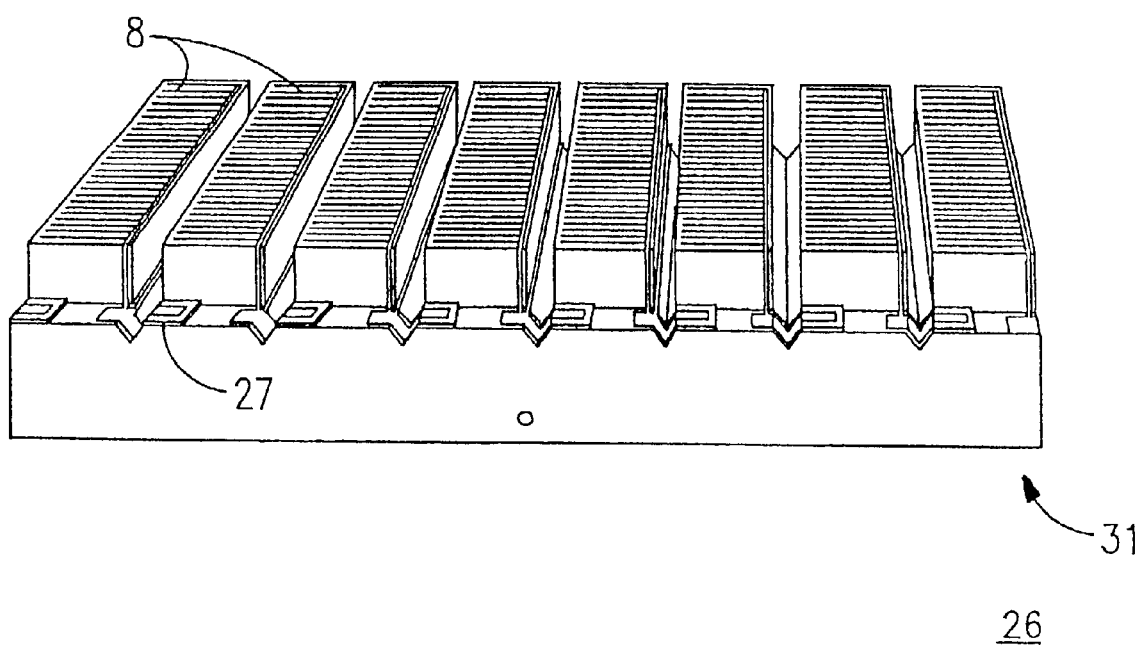

A plurality of isolation regions 26 are then formed laterally across the device from first side 23 of substrate 1 to an opposed second side thereof, to thus form a plurality of physically isolated solar cells 30 (FIG. 2E). Comb-shaped electrodes 8 are then deposited, e.g., screen printed, along the lateral extension of each solar cell, and interconnect extensions 27 are formed on adjacent terminal tabs 22 to provide series interconnection of the individual solar cells (FIG. 2F). The result is a monolithically integrated solar cell module 31 having a plurality of monolithically integrated solar cells 30 connected in series.

In accordance with one embodiment of the present invention, after layer 25 is formed on layer 24, but before the upper n-type region is diffused into layer 25, the module sub-assembly is subjected to a variation of the growth processes disclosed in the patents discussed above. Specifically, the present inventors discovered that use of the growth processes from these prior patents unexpectedly increases the aspect ratio of the resultant silicon grains if the initial silicon layer is deposited by a thin film technique, such as plasma spraying. In order to employ the growth techniques, however, a cap layer of silicon oxynitride, silicon nitride or the like must first be formed on the upper surface of layer 25. This cap layer holds the shape of layers 21, 24 and 25 during the growth process. These layers would otherwise be destroyed during the growth process, due to their relatively low thicknesses. It is necessary to strip the cap layer before diffusion of the n-type region into the upper surface of layer 25.

Test runs have revealed that, if layer 25 is plasma sprayed and then subjected to growth, the aspect ratio of grains in active p-layer 25 can exceed 5:1 (diameter:thickness). Such a high aspect ratio allows for the formation of very thin active p-layers having very wide grains, which are necessary to prevent grain boundary-induced minority carrier recombination. Such thin layers substantially reduce the amount of polycrystalline silicon raw material necessary to form an electronically effective solar cell.

Details of the growth process used herein can be found in application Ser. No. 09/033,155, now U.S. Pat. No. 6,111,191, and thus will not be reiterated here.

Figure 3:
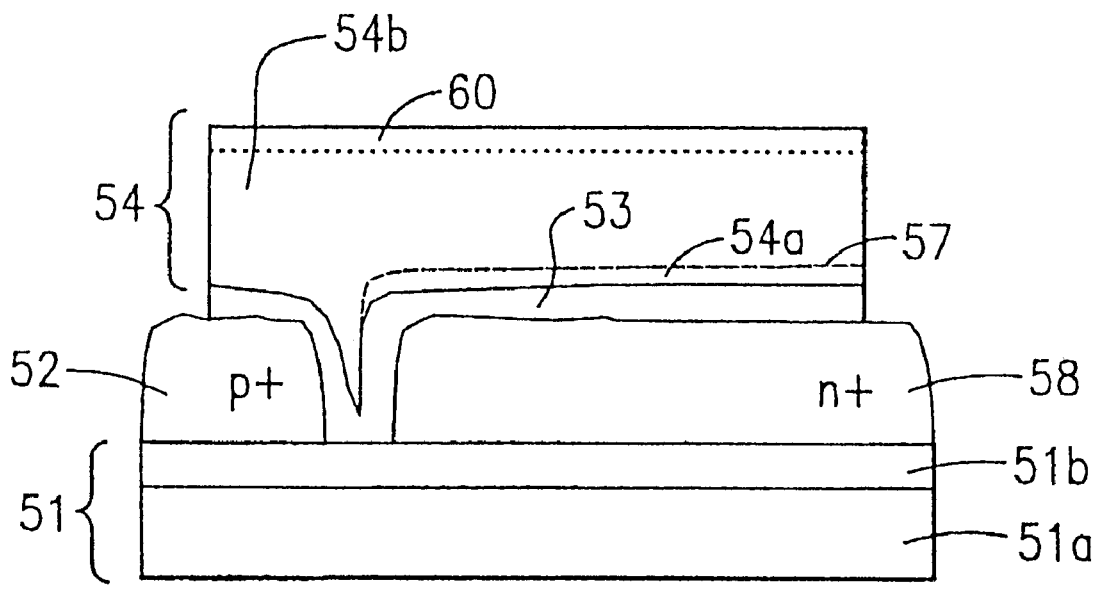
FIG. 3 is a cross-sectional view of a monolithically integrated solar cell in accordance with yet another embodiment of the present invention.

FIG. 3 is a cross-sectional view of a monolithically integrated solar cell in accordance with another embodiment of the present invention. The solar cell is formed on a supporting substrate 51. As in the case of the solar cell shown in FIG. 1, substrate 51 can be a one- or two-layer structure, provided the substrate criteria are satisfied by the respective layers, all as explained above. The particulars of substrate 51, and regions 51a and 51b, are the same as those described above with respect to substrate 1 of FIG. 1.

A first contact 52 of highly doped semiconductor material (e.g., p+-type material) is formed on the upper surface of supporting substrate 51. A second contact 58 of oppositely charged, highly doped semiconductor material (e.g., n+-type material) is also formed on the upper surface of supporting substrate 51 in spaced juxtaposition with p+ contact 52. Again, it is understood that contact 52 could be n+-type material and contact 58 could be p+-type material. The particulars of contacts 52 and 58 are the same as those described above with respect to contact 2 of FIG. 1. Additionally, while contacts 52 and 58 can take any form, they preferably are formed as interdigitated electrodes, as explained in more detail below.

A region 53 is optionally formed on the upper surface of substrate 51 to cover contacts 52 and 58 depending on the configuration, materials, and processing techniques used (as discussed above) for the other layers. Barrier region 53 serves the same functions as barrier region 3 in FIG. 1, and, accordingly, the particulars of barrier region 53 are the same as those described above with respect to barrier region 3 of FIG. 1.

The active regions of the solar cell that form the p-n junction are formed by depositing a layer 54 of semiconductor material on barrier layer 53. The material of layer 54 can be doped p-type or n-type semiconductor material (having a dopant concentration ranging from $10^{14}$ cm$^{-3}$ to $10^{17}$ cm$^3$), depending upon whether the device is to be a p-type device or an n-type device. For the sake of consistency, layer 54 will be described as a p-type material, thus making the device a p-type device.

Layer 54 is deposited as a p-type material, and a thin n-type region 54a is formed adjacent n+ contact 58 during a subsequent heat treatment, as described in more detail below. Region 54a and the remaining p-type region 54b of layer 54 form the p-n junction of the device. In an n-type device, layer 54 would be deposited as an n-type material, and a thin p-type region would be formed adjacent p+ contact 52 during a subsequent heat treatment. The particulars of layer 54, aside from the technique used to form region 56, which will be described in more detail below, are the same as those described above with respect to layer 4 of FIG. 1.

A thin region 60 is created by diffusion into the upper surface of layer 54 and serves as a passivation layer for the active layers of the device. The thickness of upper region 60 should range from 0.1 to 1.0 microns.

The solar cell shown in FIG. 3 differs from the solar cell of FIG. 1, inter alia, in the position of the contacts. That is, in the cell of FIG. 1, one of the two contacts is formed under the active layers of the device, whereas in the cell of FIG. 3, both of the contacts are formed under the active layers of the device. This reduces grid obscuration to zero and minimizes contact exposure to the environment, two drawbacks associated with conventional solar cell designs.

FIGS. 4A–4E are perspective views showing a preferred embodiment for forming a plurality of solar cells as shown in FIG. 3 in the form of a monolithically integrated solar cell module 81.

A substrate of suitable material is provided to serve as supporting substrate 51. Although a single-layer substrate is shown in the drawings, a two-layer substrate, as described above, could also be used. A plurality of sets of interdigitated electrodes 71a,71b are formed on an upper surface 70 of substrate 51. The electrodes may take the shape of a comb having a spine 85 extending laterally from a first side surface 73 of substrate 51 to an opposed side surface thereof, and a plurality of fingers 86 extending perpendicularly to spine 85. End tabs 72 of each electrode extend up to the edge of first side surface 73.

Electrode 71a is formed of highly doped p+-type silicon, for example, and electrode 71b is formed of highly doped n+-type silicon, for example. The fingers 86 of electrode 71a are interdigitated in spaced juxtaposition with the fingers 86 of electrode 71b. At least the end tab 72 of electrode 71b in the first set of electrode pairs contacts the end tab of electrode 71a in the second set of electrode pairs to provide series interconnection of adjacent solar cells. The electrodes preferably are formed in the same manner as described above with respect to FIG. 2B.

Figure 4A:
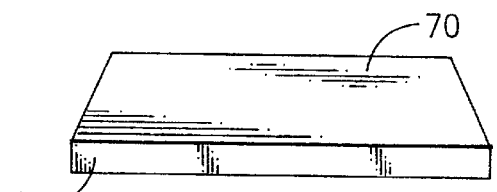
FIGS. 4A–4E depict a preferred method for producing the solar cell of FIG. 3, with FIG. 4E depicting a monolithically integrated solar cell module in accordance with another preferred embodiment of the present invention.
Figure 4B:
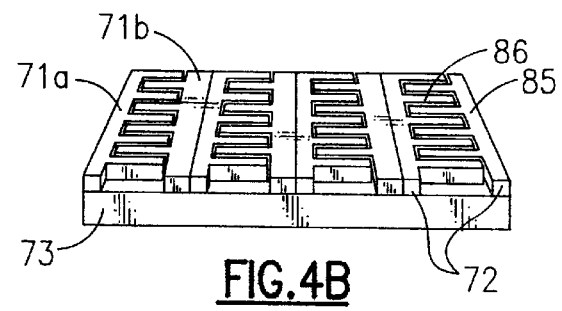
Figure 4C:
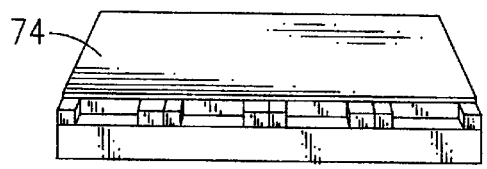
Figure 4D:
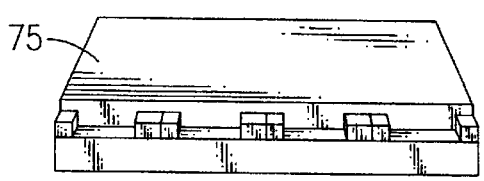

A suitable material for formation of barrier layer 53 (when used) is then deposited as a continuous layer 74 on the main regions of electrodes 71a,71b, leaving end tabs 72 exposed (FIG. 4C). A layer 75 of p-type silicon is then deposited over layer 74 (FIG. 4D), again leaving end tabs 72 exposed. The sub-assembly is then subjected to a heat treatment to form the thin region of n-type material (region 56 in FIG. 3) in layer 75 adjacent the n+ electrodes/contacts 71b. Preferably region 56 is formed during the silicon grain growth stage discussed above with respect to FIGS. 2A–2F.

The upper surface of layer 75 is then subjected to a thermal and/or chemical treatment to form an upper n-type passivation region therein, in the same manner that the upper n-type region is formed during the process of FIGS. 2A–2F.

Figure 4E:
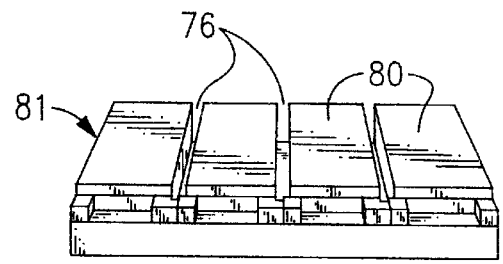

A plurality of isolation regions 76 are then formed laterally across the device from first side 73 of substrate 51 to an opposed second side thereof, to thus form a plurality of physically isolated solar cells 80 (FIG. 4E). The isolation regions 76 stop short of end tabs 72 in order to maintain series interconnection of adjacent solar cells. The result is a monolithically integrated solar cell module 81 having a plurality of monolithically integrated solar cells 80 connected in series.

A comparison of FIGS. 2A–2F to FIGS. 4A–4E shows that the latter method obviates the need for the electrode metallization and interconnection steps of the former. As such, the latter method is easier and more cost effective than the former method. Additionally, as explained above, the solar cell module resulting from the method of FIGS. 4A–4E has zero grid obscuration and shields both contacts from direct exposure to the environment.

Solar cells fabricated in accordance with the present invention have been tested under solar simulators at AstroPower and the National Renewable Energy Laboratory. The results show a high short circuit current, 25.8 mA/cm$^2$, which may be the highest current ever achieved for a silicon layer of micron-level thickness deposited on a dissimilar substrate. This current density is based on the total area of the device, which included 6% metal coverage. Quantum efficiency measurements were made that indicate that the device has a strong response well into the infrared end of the spectrum. This response indicates that the device has good minority carrier properties, surface passivation, and light trapping.

Figure 5:
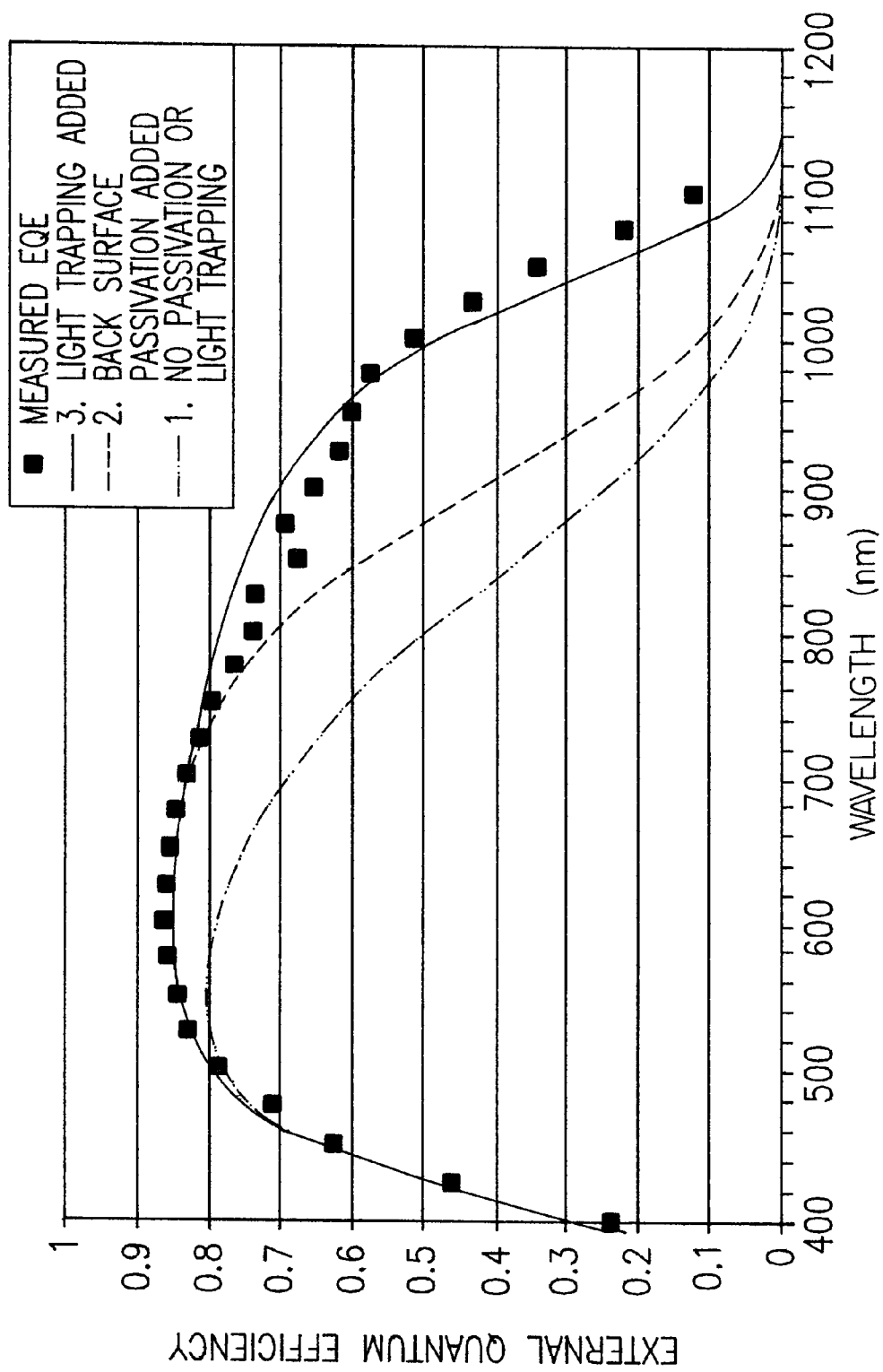
FIG. 5 is a graph showing external quantum efficiency as a function of wavelength.

External quantum efficiency data are shown in FIG. 5. Along with these experimental data are curves generated with a PC-1D [3] model. Curve 1 shows the modeled response of a thin silicon layer with excellent minority carrier bulk properties (lifetime=3.5 µs, diffusion length= 100 µm), but high levels of recombination at the back surface ($S_{b}=10^6$ cm/s) and no internal reflection. Curve 2 models the same device with excellent rear surface passivation (Sb=0 cm/s). Curve 3 adds light trapping properties to the device. Both front and rear surfaces are modeled with 90% diffuse reflection. Using these device characteristics the model predicts an effective diffusion length in excess of three times the device thickness. A comparison of curve 3 and the experimental data indicates that the device has high lifetime, high levels of surface passivation, and good light trapping properties; these characteristics account for the long wavelength response and high currents tested.

While the present invention has been described with reference to a particular preferred embodiment, it will be understood by those skilled in the art that various modifications and the like could be made thereto without departing from the spirit and scope of the invention as defined in the following claims.

We claim:

1. A solar cell comprising:
   (a) an electrically insulating substrate;
   (b) a first ohmic contact layer formed on or in said substrate, said first ohmic contact layer comprising a highly electronically conductive material having a first conductivity type, said highly electronically conductive material comprising at least one material selected from the group consisting of graphite, silicides and carbides;
   (c) a first layer of doped semiconductor material formed on said first ohmic contact layer and having a first conductivity type the same as that of said first ohmic contact layer;
   (d) a second layer of doped semiconductor material formed on said first layer of doped semiconductor material and having a conductivity type opposite to that of said first layer of doped semiconductor material, said first and second layers of doped semiconductor material forming a p-n junction; and
   (e) a second ohmic contact layer formed on said second layer of doped semiconductor material in physical isolation from said first ohmic contact layer.

2. The solar cell of claim 1, wherein said first ohmic contact layer comprises at least one material selected from the group consisting of SiC, $B_4C$ and graphite.

3. A solar cell comprising:
   (a) an electrically insulating substrate;
   (b) a first ohmic contact layer formed on or in said substrate, said first ohmic contact layer comprising a highly electronically conductive material having a first conductivity type;
   (c) a first layer of doped semiconductor material formed on said first ohmic contact layer and having a first conductivity type the same as that of said first ohmic contact layer;
   (d) a second layer of doped semiconductor material formed on said first layer of doped semiconductor material and having a conductivity type opposite to that of said first layer of doped semiconductor material, said first and second layers of doped semiconductor material forming a p-n junction; and
   (e) a second ohmic contact layer formed on said second layer of doped semiconductor material in physical isolation from said first ohmic contact layer,
   wherein the composition of said first ohmic contact layer is substantially the same as that of said first layer of doped semiconductor material, and said solar cell further comprises a barrier layer between said first ohmic contact layer and said first layer of doped semiconductor material.

4. The solar cell of claim 3, wherein said barrier layer has a thickness sufficient to provide (i) mechanical separation of the first ohmic contact layer from the first layer of doped semiconductor material during manufacture of the solar cell, and (ii) electronic conduction therethrough during operation of the solar cell.

5. The solar cell of claim 4, wherein said barrier layer comprises a material selected from the group consisting of silicon oxide, silicon dioxide, sialon, silicon nitride, silicon oxynitride, silicon carbide and silicon oxycarbide.

6. A solar cell module comprising:
   (a) an electrically insulating substrate;
   (b) at least two solar cells disposed on said substrate in physical isolation from one another, each solar cell comprising:
      (i) a first ohmic contact layer formed on or in said substrate,
      (ii) a first layer of doped semiconductor material formed on said first ohmic contact layer and having a first conductivity type,
      (iii) a second layer of doped semiconductor material formed on said first layer of doped semiconductor material and having a conductivity type opposite to that of said first layer of doped semiconductor material, said first and second layers of doped semiconductor material forming a p-n junction; and
      (iv) a second ohmic contact layer formed on said second layer of doped semiconductor material in physical isolation from said first ohmic contact layer; and
   (c) an electronically conductive interconnect providing electrical communication between said second ohmic contact layer of one solar cell and said first ohmic contact layer of the other solar cell while maintaining the two solar cells in physical isolation from one another,
   wherein the composition of said first ohmic contact layer is substantially the same as that of said first layer of doped semiconductor material, and said solar cell further comprises a barrier layer formed therebetween.

7. The solar cell module of claim 6, wherein said barrier layer has a thickness sufficient to provide (i) mechanical separation of the first ohmic contact layer from the first layer of doped semiconductor material during manufacture of the solar cell module, and (ii) electronic conduction therethrough during operation of the solar cell module.

8. The solar cell module of claim 6, wherein said barrier layer comprises a material selected from the group consisting of silicon oxide, silicon dioxide, sialon, silicon nitride, silicon oxynitride, silicon carbide and silicon oxycarbide.

9. The solar cell module of claim 6, wherein said first ohmic contact layer comprises a highly electronically conductive material having a first conductivity type the same as that of said first layer of doped semiconductor material.

10. The solar cell module of claim 9, wherein said first ohmic contact layer comprises at least one material selected from the group consisting of silicides and carbides.

11. The solar cell module of claim 9, wherein said first ohmic contact layer comprises at least one material selected from the group consisting of Si, SiC, $B_4C$ and graphite.

12. A solar cell comprising:
    (a) an electrically insulating substrate;
    (b) a first ohmic contact formed on or in said substrate;
    (c) a second ohmic contact formed on or in said substrate in spaced juxtaposition with said first ohmic contact; and (d) a layer of doped semiconductor material disposed on said first and second ohmic contacts, said layer including one of (i) an upper p-region and a lower n- region adjacent said first ohmic contact, and (ii) an upper n-region and a lower p- region adjacent said second ohmic contact, wherein a p- junction is formed between the upper and lower regions, wherein the solar cell further comprises a barrier layer between said first and second ohmic contacts and said layer of doped semiconductor material.

13. The solar cell of claim 12, wherein said first ohmic contact comprises a highly electronically conductive material having n- type conductivity, and said second ohmic contact comprises a highly electronically conductive material having p- type conductivity.

14. The solar cell of claim 13, wherein said first ohmic contact is selected from the group consisting of silicides and carbides.

15. The solar cell of claim 13, wherein said first ohmic contact comprises at least one material selected from the group consisting of Si, SiC, $B_4C$ and graphite.

16. The solar cell of claim 12, wherein said barrier layer has a thickness sufficient to provide (i) mechanical separation of the first and second ohmic contacts from the layer of doped semiconductor material during manufacture of the solar cell, and (ii) electronic conduction therethrough during operation of the solar cell.

17. The solar cell of claim 12, wherein said barrier layer comprises a material selected from the group consisting of silicon oxide, silicon dioxide, sialon, silicon nitride, silicon oxynitride, silicon carbide and silicon oxycarbide.

18. The solar cell of claim 12, wherein each of said first and second ohmic contacts comprises a spine member and a plurality of fingers extending substantially perpendicular to the spine member, and the fingers of said first ohmic contact are interdigitated with the fingers of said second ohmic contact.

19. The solar cell of claim 12, further comprising, in said layer of doped semiconductor material, a surface region having a conductivity type opposite to that of said upper region.

20. A solar cell module, comprising:

(a) an electrically insulating substrate; and
(b) at least two solar cells disposed on said substrate, each solar cell comprising:

(i) a first ohmic contact formed on or in said substrate,
(ii) a second ohmic contact formed on or in said substrate in spaced juxtaposition with said first ohmic contact, and
(iii) a layer of doped semiconductor material disposed on said first and second ohmic contacts, said layer including one of (1) an upper p-region and a lower n-region adjacent said first ohmic contact, and (2) an upper n-region and a lower p- region adjacent said second ohmic contact, wherein a p-n junction is formed between said upper and lower regions;

wherein the solar cells are connected physically and electrically only at laterally terminal end portions of said first ohmic contact of one solar cell and said second ohmic contact of the other solar cell, and wherein said layer of doped semiconductor material is delimited by a boundary and said terminal end portions are positioned outside said boundary.

21. A solar cell module, comprising:

(a) an electrically insulating substrate; and
(b) at least two solar cells disposed on said substrate, each solar cell comprising:

(i) a comb-shaped n+ contact formed on or in said substrate,
(ii) a comb-shaped p+ contact formed on or in said substrate interdigitated with said n+ contact,
(iii) a barrier layer formed on said n+ and p+ contacts,
(iv) a layer of doped semiconductor material disposed on said barrier layer, said layer including one of (1) an upper p- region and a lower n- region adjacent said n+ contact, and (2) an upper n- region and a lower p- region adjacent said p+contact, wherein a p-n junction is formed between said upper and lower regions;

wherein the solar cells are connected physically and electrically only at laterally terminal end portions of the p+ contact of one solar cell and the n+ contact of the other solar cell, and wherein said layer of doped semiconductor material is delimited by a boundary and said terminal end portions are positioned outside said boundary.

* * * * *

UNITED STATES PATENT AND TRADEMARK OFFICE
CERTIFICATE OF CORRECTION

PATENT NO. : 6,420,643 B2
DATED : July 16, 2002
INVENTOR(S) : David H. Ford, Allen M. Barnett and Robert B. Hall It is certified that error appears in the above-identified patent and that said Letters Patent is hereby corrected as shown below:

<u>Title page,</u>
Item [75], Inventors: please delete "James A. Rand, Landenberg, PA (US)."

Signed and Sealed this

Fifth Day of November, 2002

Attest:

Attesting Officer

JAMES E. ROGAN
*Director of the United States Patent and Trademark Office*